(12) United States Patent
Philipp et al.

(10) Patent No.: US 7,977,661 B2
(45) Date of Patent: Jul. 12, 2011

(54) MEMORY HAVING SHARED STORAGE MATERIAL

(75) Inventors: Jan Boris Philipp, Peekskill, NY (US); Thomas Happ, Tarrytown, NY (US)

(73) Assignee: Qimonda AG, Munich (DE)

( * ) Notice: Subject to any disclaimer, the term of this patent is extended or adjusted under 35 U.S.C. 154(b) by 169 days.

(21) Appl. No.: 11/759,446

(22) Filed: Jun. 7, 2007

(65) Prior Publication Data
US 2008/0304310 A1 Dec. 11, 2008

(51) Int. Cl.
*H01L 21/00* (2006.01)
(52) U.S. Cl. .......... 257/2; 257/3; 257/E29.002; 365/148
(58) Field of Classification Search .................. 257/2, 3, 257/E29.002, E21.001; 365/148
See application file for complete search history.

(56) References Cited

U.S. PATENT DOCUMENTS

| | | | |
|---|---|---|---|
| 4,319,342 A * | 3/1982 | Scheuerlein | ............... 365/149 |
| 5,714,768 A | 2/1998 | Ovshinsky et al. | |
| 5,814,527 A * | 9/1998 | Wolstenholme et al. | ......... 438/5 |
| 6,597,031 B2 * | 7/2003 | Kuge | ........................... 257/295 |
| 7,038,261 B2 | 5/2006 | Horii | |
| 7,053,431 B2 | 5/2006 | Ogiwara | |
| 7,071,485 B2 | 7/2006 | Takuara et al. | |
| 7,368,802 B2 * | 5/2008 | Hayakawa | .................... 257/529 |
| 2003/0185047 A1 * | 10/2003 | Khouri et al. | ................ 365/163 |
| 2005/0098811 A1 * | 5/2005 | Ogiwara | ....................... 257/295 |
| 2005/0185444 A1 * | 8/2005 | Yang et al. | .................... 365/148 |

FOREIGN PATENT DOCUMENTS
DE 102005001253 7/2006

OTHER PUBLICATIONS

"OUM—180 nm Nonvolatile Memory Cell Element Technology for Stand Alone and Embedded Applications", Stefan Lai, et al., Intel Corporation (4 pgs.).
"Current Status of the Phase Change Memory and its Future", Stefan Lai, Intel Corporation, IEEE 2003 (4 pgs.).
"Phase-Change Chalcogenide Nonvolatile RAM Completely Based on CMOS Technology", Y.N. Hwang, et al., IEEE 2003 (3 pgs.).
"OUM, Ovonic Unified Memory", ECD Ovonics, Research Report, http://www.ovonics.com/PDFs/Elec_Memory_Research_Report/OUM.pdf, 1999 (80 pgs.).
"A Novel Cell Technology Using N-doped GeSbTe Films for Phase Change RAM", H. Horii, et al., Samsung Electronics Co., Ltd, (2 pgs.).
"Full Integration and Reliability Evaluation of Phase-Change RAM Based on .24um-CMOS Technologies", Y.N. Hwang, et al., Symposium on VLSI Technology Digest of Technical Papers, 2003 (2 pgs.).
"Switching Current Scaling and Reliability Evaluation in PRAM", C.W. Jeong, et al., Samsung Electronics Co., Ltd., (2 pgs.).
"Highly Scalable On-axis Confined Cell Structure for High Denisty PRAM beyond 256Mb", S.L. Cho, et al., Symposium of VLSI Technology Digest of Technical Papers, 2005 (2 pgs.).

(Continued)

*Primary Examiner* — Thinh T Nguyen
(74) *Attorney, Agent, or Firm* — Dicke, Billig & Czaja, PLLC

(57) ABSTRACT

An integrated circuit includes a bit line, a plurality of access devices coupled to the bit line, and a plate of phase change material. The integrated circuit includes a plurality of phase change elements contacting the plate of phase change material and a plurality of first contacts. Each first contact is coupled between an access device and a phase change element.

23 Claims, 14 Drawing Sheets

OTHER PUBLICATIONS

"Novel uTrench Phase-Change Memory Cell for Embedded and Stand-Alone Non-Volatile Memory Applications", F. Pellizzer, et al., Symposium of VLSI Technology Digest of Technical Papers, 2004 (2 pgs.).

"Highly Manufacturable High Density Phase Change Memory of 64Mb and Beyond", S.J. Ahn, et al., Samsung Electronics Co., Ltd., (4 pgs.).

A 0.1um 1.8V 256Mb 66MHz Synchronous Burst PRAM., Sangeom Kang, et al., ISSCC 2006 (3 pgs.).

* cited by examiner

MEMORY HAVING SHARED STORAGE MATERIAL

CROSS-REFERENCE TO RELATED APPLICATIONS

This Utility Patent Application is related to U.S. patent application Ser. No. 11/759,467, entitled "MEMORY HAVING SHARED STORAGE MATERIAL," filed on the same date as the present application, and which is incorporated herein by reference.

BACKGROUND

One type of memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. If the phase change memory cell is programmed to one of three different resistance levels, 1.5 bits of data per cell can be stored. If the phase change memory cell is programmed to one of four different resistance levels, two bits of data per cell can be stored, and so on.

During fabrication of phase change memory cells, phase change material is typically etched to form storage locations. Etching phase change material, however, may damage the edges of the phase change material and may be difficult to control. The impact of the damaged phase change material increases as the critical dimension of the phase change memory cells is reduced. As the critical dimension of the phase change memory cells is reduced, the damaged phase change material includes a larger percentage of the storage location. If the percentage of damaged phase change material is too large, the phase change memory cell may not function properly.

For these and other reasons, there is a need for the present invention.

SUMMARY

One embodiment provides an integrated circuit. The integrated circuit includes a bit line, a plurality of access devices coupled to the bit line, and a plate of phase change material. The integrated circuit includes a plurality of phase change elements contacting the plate of phase change material and a plurality of first contacts. Each first contact is coupled between an access device and a phase change element.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
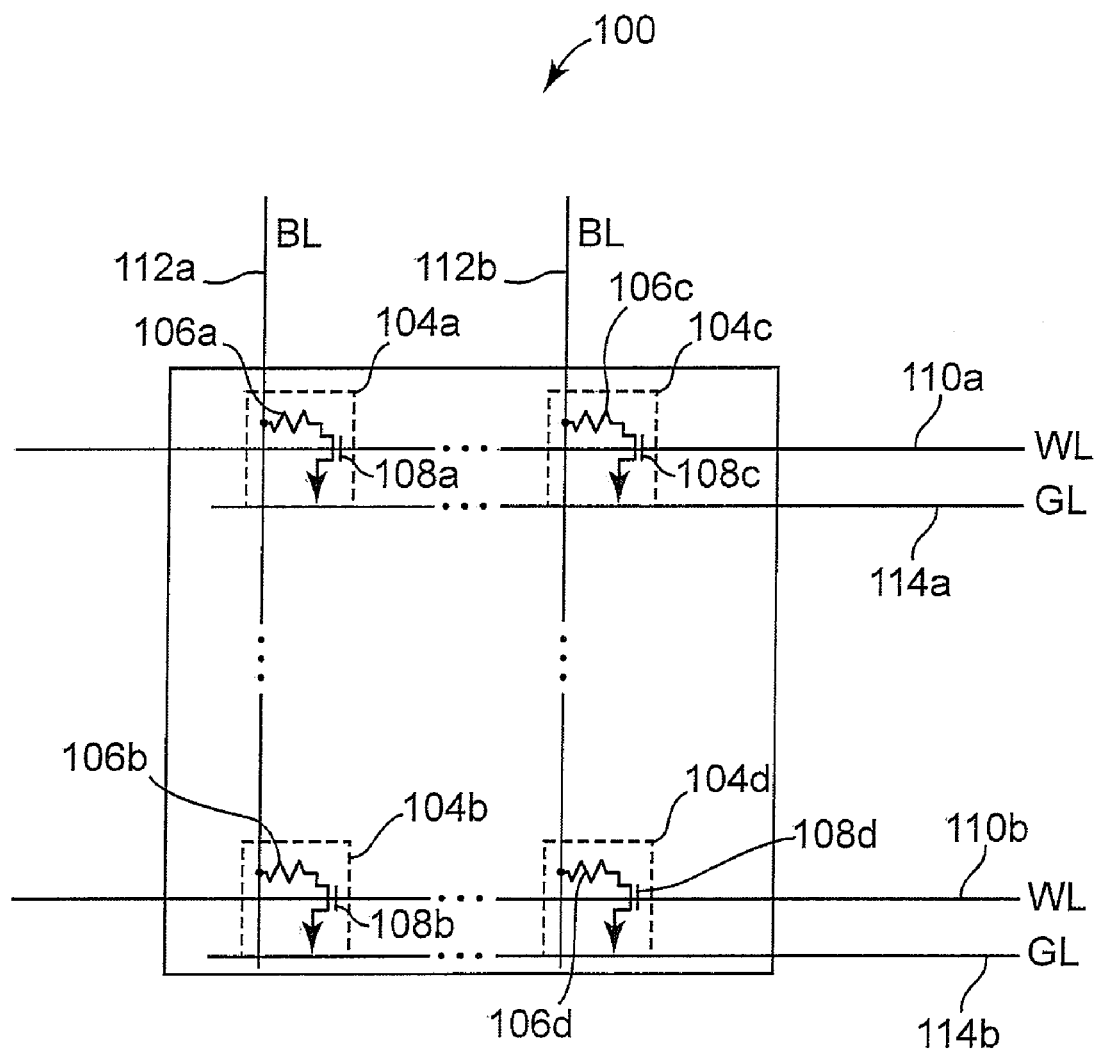
FIG. 1 is a diagram illustrating one embodiment of an array of phase change memory cells.

FIG. 1 is a diagram illustrating one embodiment of an array of phase change memory cells 100. Memory array 100 includes a plurality of phase change memory cells 104a-104d (collectively referred to as phase change memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114). Memory array 100 also includes a plurality of lines of phase change material, each line of phase change material aligned with, contacting, and running along a bit line 112.

As used herein, the term "electrically coupled" is not meant to mean that the elements must be directly coupled together and intervening elements may be provided between the "electrically coupled" elements.

Each phase change memory cell 104 is electrically coupled to a word line 110, a bit line 112, and a ground line 114. For example, phase change memory cell 104a is electrically coupled to bit line 112a, word line 110a, and ground line 114a, and phase change memory cell 104b is electrically coupled to bit line 112a, word line 110b, and ground line 114b. Phase change memory cell 104c is electrically coupled to bit line 112b, word line 110a, and ground line 114a, and phase change memory cell 104d is electrically coupled to bit line 112b, word line 110b, and ground line 114b.

Each phase change memory cell 104 includes a phase change element 106 and a transistor 108. While transistor 108 is a field-effect transistor (FET) in the illustrated embodiment, in other embodiments, transistor 108 can be other suitable devices such as a bipolar transistor or a 3D transistor structure. Phase change memory cell 104a includes phase change element 106a and transistor 108a. One side of phase change element 106a is electrically coupled to bit line 112a through a line of phase change material running along bit line 112a, and the other side of phase change element 106a is electrically coupled to one side of the source-drain path of transistor 108a. The other side of the source-drain path of transistor 108a is electrically coupled to ground line 114a. The gate of transistor 108a is electrically coupled to word line 110a.

Phase change memory cell 104b includes phase change element 106b and transistor 108b. One side of phase change element 106b is electrically coupled to bit line 112a through the line of phase change material running along bit line 112a, and the other side of phase change element 106b is electrically coupled to one side of the source-drain path of transistor 108b. The other side of the source-drain path of transistor 108b is electrically coupled to ground line 114b. The gate of transistor 108b is electrically coupled to word line 110b.

Phase change memory cell 104c includes phase change element 106c and transistor 108c. One side of phase change element 106c is electrically coupled to bit line 112b through a line of phase change material running along bit line 112b, and the other side of phase change element 106c is electrically coupled to one side of the source-drain path of transistor 108c. The other side of the source-drain path of transistor 108c is electrically coupled to ground line 114a. The gate of transistor 108c is electrically coupled to word line 110a.

Phase change memory cell 104d includes phase change element 106d and transistor 108d. One side of phase change element 106d is electrically coupled to bit line 112b through the line of phase change material running along bit line 112b, and the other side of phase change element 106d is electrically coupled to one side of the source-drain path of transistor 108*d*. The other side of the source-drain path of transistor 108*d* is electrically coupled to ground line 114*b*. The gate of transistor 108*d* is electrically coupled to word line 110*b*.

Each phase change element 106 and line of phase change material comprises a phase change material that may be made up of a variety of materials in accordance with the present invention. Generally, chalcogenide alloys that contain one or more elements from group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

During a set operation of phase change memory cell 104*a*, a set current or voltage pulse is selectively enabled and sent through bit line 112*a* and the line of phase change material to phase change element 106*a* thereby heating phase change element 106*a* above its crystallization temperature (but usually below its melting temperature) with word line 110*a* selected to activate transistor 108*a*. In this way, phase change element 106*a* reaches its crystalline state during this set operation. During a reset operation of phase change memory cell 104*a*, a reset current or voltage pulse is selectively enabled and sent through bit line 1.2*a* and the line of phase change material to phase change element 106*a*. The reset current or voltage quickly heats phase change element 106*a* above its melting temperature. After the current or voltage pulse is turned off, the phase change element 106*a* quickly quench cools into the amorphous state. Phase change memory cells 104*b*-104*d* and other phase change memory cells 104 in memory array 100 are set and reset similarly to phase change memory cell 104*a* using a similar current or voltage pulse.

Figure 2:
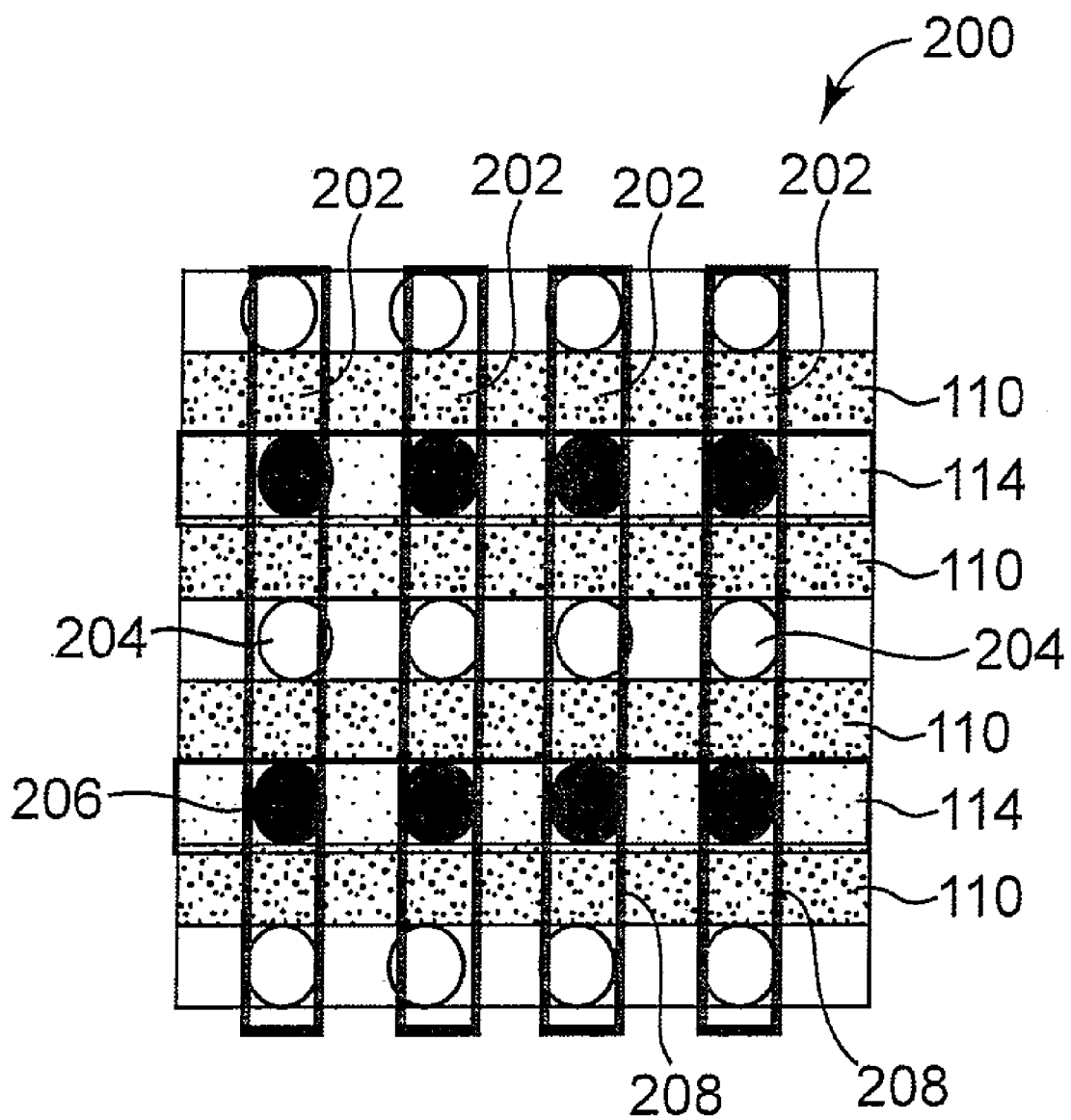
FIG. 2 illustrates a top view of one embodiment of an array of phase change memory cells.

FIG. 2 illustrates a top view of one embodiment of an array of phase change memory cells 200. Array of phase change memory cells 200 includes bit lines and phase change material lines indicated at 202, ground lines 114, and word lines 110. Memory cells are electrically coupled to bit lines and phase change material lines 202 through contacts 204. Memory cells are electrically coupled to ground lines 114 through contacts 206. Word lines 110 are straight lines and bit lines and phase change material lines 202 are straight lines. Bit lines and phase change material lines 202 are perpendicular to word lines 110. Ground lines 114 run parallel to and between word lines 110.

Array of phase change memory cells 200 includes dual gate phase change memory cells. Array of phase change memory cells 200 has a cell size down to $8F^2$, where F is the minimum feature size. Bit lines and phase change material lines 202 are electrically coupled to one side of the phase change memory elements. The other sides of the phase change memory elements are electrically coupled to one side of the source-drain paths of the transistors through contacts 204. Word lines 110 are coupled to the gates of the transistors. The other sides of the source-drain paths of the transistors are electrically coupled to ground lines 114 through contacts 206. Each contact 206 is shared by two transistors for accessing two phase change memory elements. In one embodiment, ground lines 114 are below bit lines and phase change material lines 202. In another embodiment, bit lines and phase change material lines 202 are below ground lines 114.

The active areas of transistors within array of phase change memory cells 200 are indicated at 208. Contacts 204 and 206 are aligned along bit lines and phase change material lines 202. Likewise, the active areas 208 of transistors within array of phase change memory cells 200 are also aligned with bit lines and phase change material lines 202.

Figure 3A:
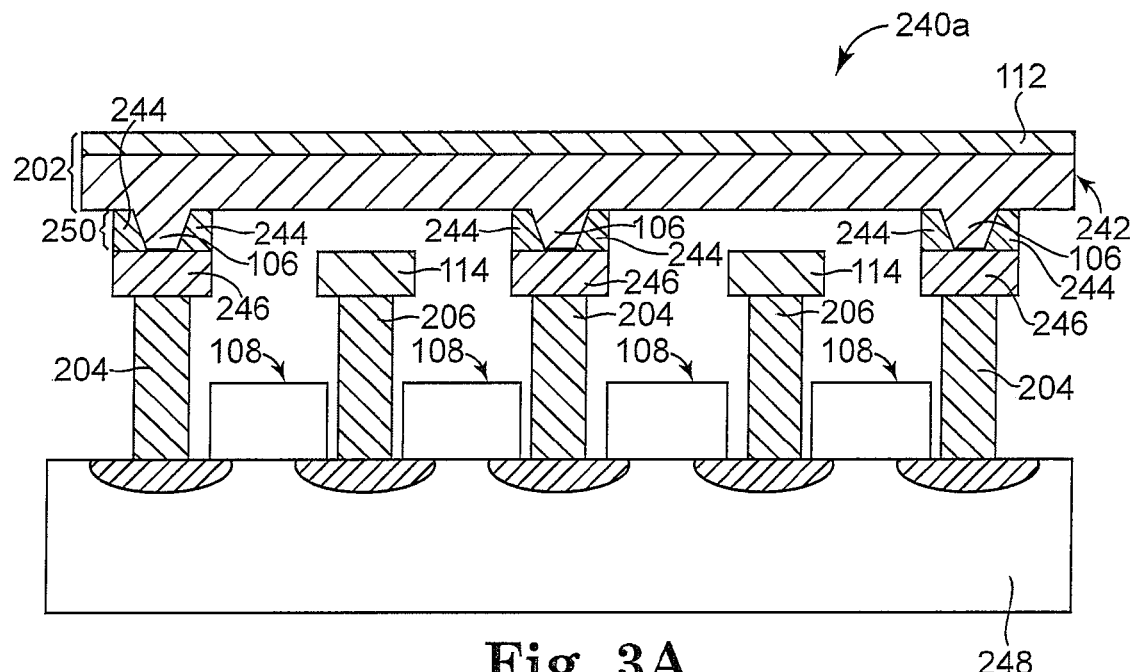
FIG. 3A illustrates a simplified side view of one embodiment of an array of phase change memory cells.

FIG. 3A illustrates a simplified side view of one embodiment of an array of phase change memory cells 240*a*. In one embodiment, array of phase change memory cells 240*a* is similar to array of phase change memory cells 100 (FIG. 1). Array 240*a* includes substrate 248, bit lines and phase change material lines 202, ground lines 114, transistors 108, contacts 204, contacts 206, electrodes 246, and storage locations 250 including phase change elements 106 and insulation material 244. Each bit line and phase change material line 202 includes a bit line 112 and a phase change material line 242. Bit lines 112 and ground lines 114 are in separate metallization layers. In one embodiment, bit lines 112 comprise W or another suitable metal and are in a lower metallization layer than ground lines 114, which comprise Al, Cu, or another suitable metal. In another embodiment, bit lines 112 comprise Al, Cu, or another suitable metal and are in a higher metallization layer than ground lines 114, which comprise W or another suitable metal.

In one embodiment, bit lines 112 are perpendicular to ground lines 114. One side of the source-drain path of each transistor 108 is electrically coupled to a ground line 114 through a contact 206, which comprises Cu, W, or another suitable electrically conductive material. The other side of the source-drain path of each transistor 108 is electrically coupled to an electrode 246 through a contact 204, which comprises Cu, W, or another suitable electrically conductive material. Each electrode 246 is electrically coupled to a phase change element 106. Each phase change element 106 is laterally surrounded by insulation material 244. Each phase change element 106 contacts phase change material line 242, which contacts bit line 112. The gate of each transistor 108 is electrically coupled to a word line 110, which comprises doped poly-Si, W, TiN, NiSi, CoSi, TiSi, $WSi_x$, or another suitable material. In one embodiment, memory element 106 is a via element or other suitable phase change memory element.

During fabrication of array of phase change memory cells 240*a*, phase change material is deposited over an insulation material layer that has had V-shaped openings etched into it to expose portions of electrodes 246. The phase change material fills the openings to form phase change elements 106 and covers the insulation material layer. The phase change material is then planarized and etched using line lithography to form phase change material lines 242. In another embodiment, conductive material is deposited over the phase change material and the conductive material and the phase change material are etched at the same time to form bits lines 112 and phase change material lines 242. In either embodiment, individual etching of each phase change element 106 and thus edge damage due to the etching is avoided.

Figure 3B:
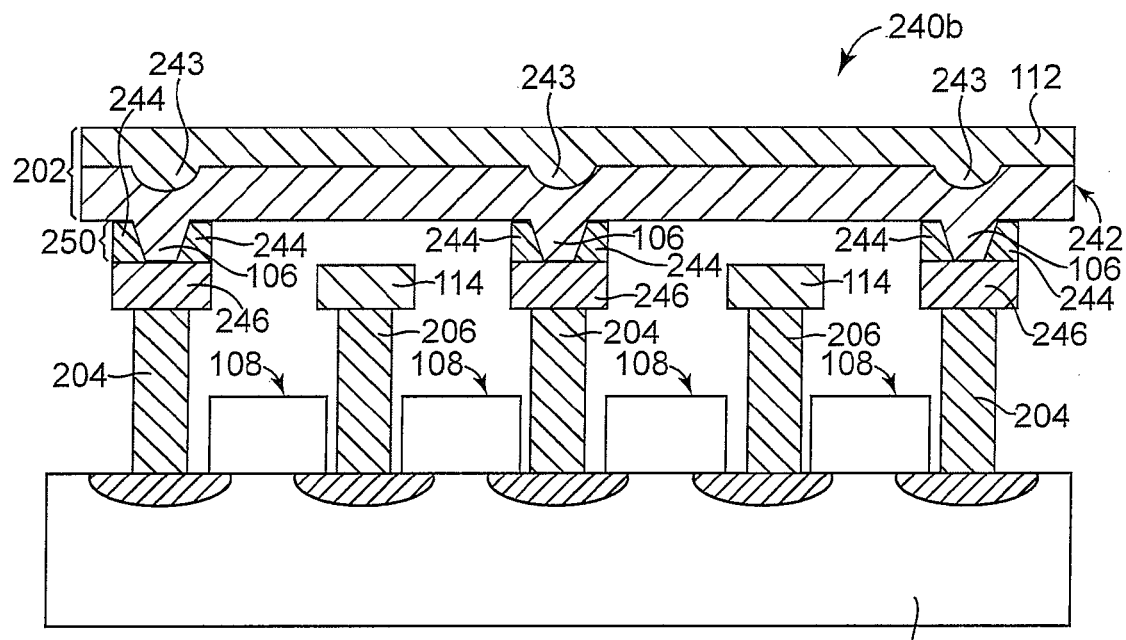
FIG. 3B illustrates a simplified side view of another embodiment of an array of phase change memory cells.

FIG. 3B illustrates a simplified side view of another embodiment of an array of phase change memory cells 240*b*. Array of phase change memory cells 240*b* is similar to array of phase change memory cells 240*a* previously described and illustrated with reference to FIG. 3A, except that array of phase change memory cells 240*b* includes indentations 243 in phase change material line 242. The indentations in phase change material line 242 result from not planarizing the phase change material after depositing the phase change material. Indentations 243 are filled with conductive material when the conductive material is deposited. Indentations 243 reduce the distance between bit lines 112 and electrodes 246, thereby reducing the risk of cross-talk between adjacent memory cells.

Figure 4A:
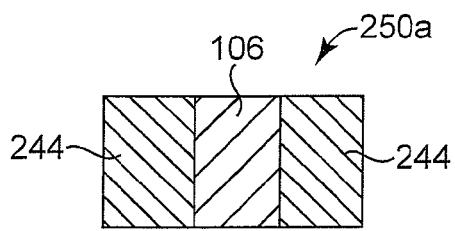
FIG. 4A illustrates a cross-sectional view of one embodiment of a storage location.

FIG. 4A illustrates a cross-sectional view of one embodiment of a storage location 250a. Storage location 250a can be used in array of phase change memory cells 240a (FIG. 3A) or array of phase change memory cells 240b (FIG. 3B). Storage location 250a can be electrically coupled between electrode 246 and phase change material line 242. Storage location 250a includes phase change element 106 and insulation material 244. In this embodiment, phase change element 106 is cylindrical in shape and insulation material 244 laterally surrounds phase change element 106.

Figure 4B:
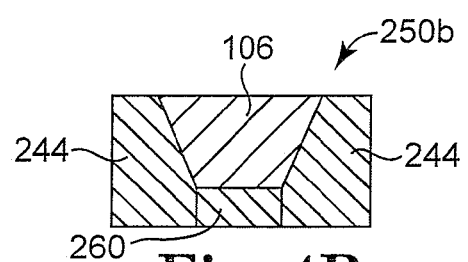
FIG. 4B illustrates a cross-sectional view of another embodiment of a storage location.

FIG. 4B illustrates a cross-sectional view of another embodiment of a storage location 250b. Storage location 250b can be used in array of phase change memory cells 240a (FIG. 3A) or array of phase change memory cells 240b (FIG. 3B). Storage location 250b can be electrically coupled between electrode 246 and phase change material line 242. Storage location 250b includes heater contact 260, phase change element 106, and insulation material 244. In this embodiment, phase change element 106 is V-shaped and heater contact 260 is cylindrical in shape and contacts the bottom of phase change element 106. Insulation material 244 laterally surrounds phase change element 106 and heater contact 260.

Figure 4C:
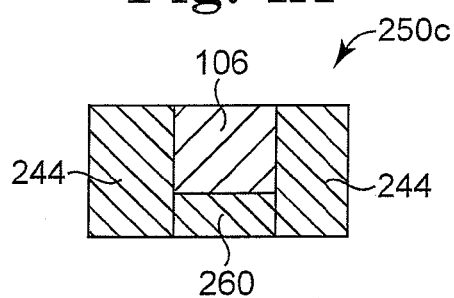
FIG. 4C illustrates a cross-sectional view of another embodiment of a storage location.

FIG. 4C illustrates a cross-sectional view of another embodiment of a storage location 250c. Storage location 250c can be used in array of phase change memory cells 240a (FIG. 3A) or array of phase change memory cells 240b (FIG. 3B). Storage location 250c can be electrically coupled between electrode 246 and phase change material line 242. Storage location 250c includes heater contact 260, phase change element 106, and insulation material 244. In this embodiment, phase change element 106 is cylindrical in shape and heater contact 260 is also cylindrical in shape and contacts the bottom of phase change element 106. Insulation material 244 laterally surrounds phase change element 106 and heater contact 260.

Figure 4D:
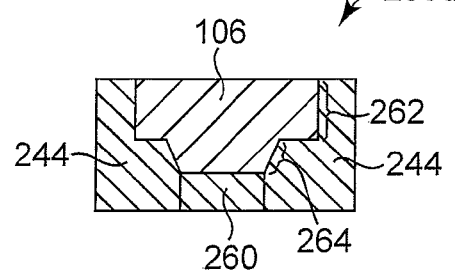
FIG. 4D illustrates a cross-sectional view of another embodiment of a storage location.

FIG. 4D illustrates a cross-sectional view of another embodiment of a storage location 250d. Storage location 250d can be used in array of phase change memory cells 240a (FIG. 3A) or array of phase change memory cells 240b (FIG. 3B). Storage location 250d can be electrically coupled between electrode 246 and phase change material line 242. Storage location 250d includes heater contact 260, phase change element 106, and insulation material 244. In this embodiment, phase change element 106 includes a cylindrical top portion 262 contacting a V-shaped lower portion 264. Heater contact 260 is cylindrical in shape and contacts the bottom of lower portion 264 of phase change element 106. Insulation material 244 laterally surrounds phase change element 106 and heater contact 260.

Figure 4E:
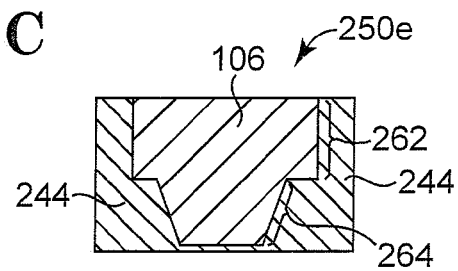
FIG. 4E illustrates a cross-sectional view of another embodiment of a storage location.

FIG. 4E illustrates a cross-sectional view of another embodiment of a storage location 250e. Storage location 250e can be used in array of phase change memory cells 240a (FIG. 3A) or array of phase change memory cells 240b (FIG. 3B). Storage location 250e can be electrically coupled between electrode 246 and phase change material line 242. Storage location 250e includes phase change element 106 and insulation material 244. In this embodiment, phase change element 106 includes a cylindrical top portion 262 contacting a V-shaped lower portion 264. Insulation material 244 laterally surrounds phase change element 106.

Figure 5A:
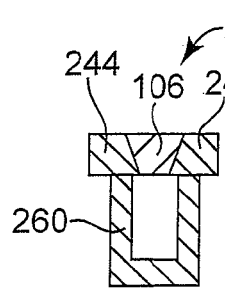
FIG. 5A illustrates a cross-sectional view of another embodiment of a storage location.
Figure 5B:
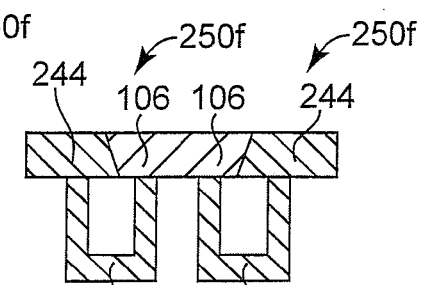
FIG. 5B illustrates a perpendicular cross-sectional view of the embodiment of the storage location illustrated in FIG. 5A.

FIG. 5A illustrates a cross-sectional view of another embodiment of two storage locations 250f, and FIG. 5B illustrates a perpendicular cross-sectional view of the two storage locations 250f. Each storage location 250f can be used in array of phase change memory cells 240a (FIG. 3A) or array of phase change memory cells 240b (FIG. 3B). Each storage location 250f can be electrically coupled between electrode 246 and phase change material line 242. Storage locations 250f include phase change elements 106, insulation material 244, and heater contacts 260. In this embodiment, there are two phase change elements 106 for each V-shaped phase change portion in insulation material 244. Heater contacts 260 are cup shaped. At the intersection of heater contacts 260 and the phase change material, phase change elements 106 are formed.

Figure 6A:
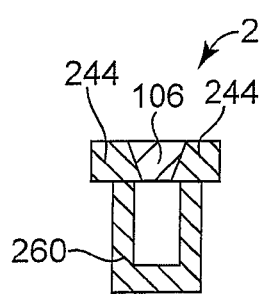
FIG. 6A illustrates a cross-sectional view of another embodiment of a storage location.
Figure 6B:
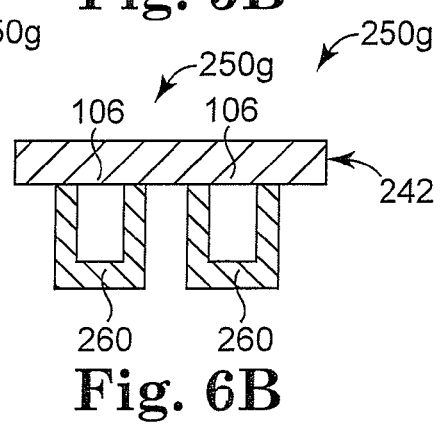
FIG. 6B illustrates a perpendicular cross-sectional view of the embodiment of the storage location illustrated in FIG. 6A.

FIG. 6A illustrates a cross-sectional view of another embodiment of two storage locations 250g, and FIG. 6B illustrates a perpendicular cross-sectional view of the two storage location 250g. Each storage location 250g can be used in array of phase change memory cells 240a (FIG. 3A) or array of phase change memory cells 240b (FIG. 3B). Each storage location 250g can be electrically coupled between electrode 246 and phase change material line 242. Storage locations 250g include phase change elements 106, insulation material 244, and heater contacts 260. In this embodiment, there are two phase change elements 106 for each V-shaped phase change trench opening in insulation material 244. Heater contacts 260 are cup shaped. At the intersection of heater contacts 260 and the phase change material, phase change elements 106 are formed.

Figure 7:
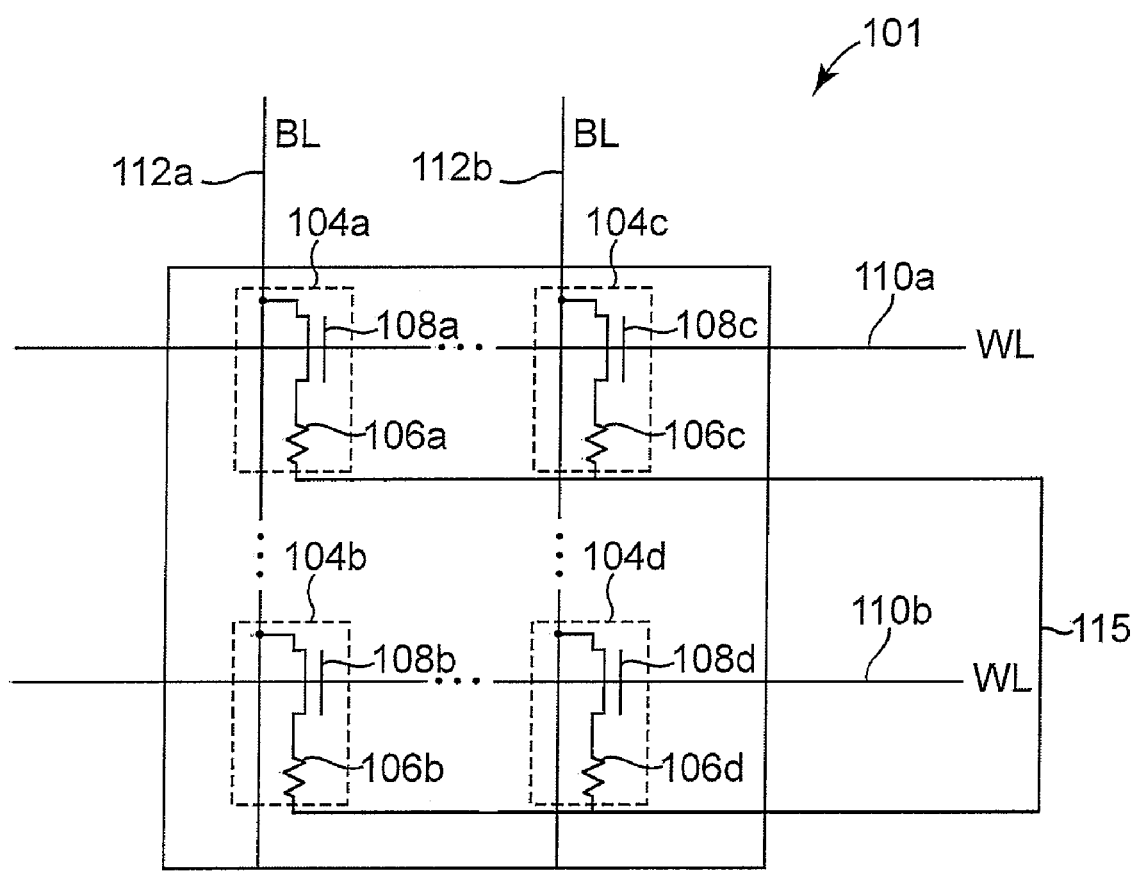
FIG. 7 is a diagram illustrating another embodiment of an array of phase change memory cells.

FIG. 7 is a diagram illustrating another embodiment of an array of phase change memory cells 101. Memory array 101 includes phase change memory cells 104a-104d, bit lines 112a-112b, word lines 110a-110b, and a common or ground plate 115. Memory array 101 also includes a plate of phase change material aligned with and contacting common or ground plate 115.

Each phase change memory cell 104 is electrically coupled to a word line 110, a bit line 112, and common or ground plate 115. For example, phase change memory cell 104a is electrically coupled to bit line 112a, word line 110a, and common or ground plate 115, and phase change memory cell 104b is electrically coupled to bit line 112a, word line 110b, and common or ground plate 115. Phase change memory cell 104c is electrically coupled to bit line 112b, word line 110a, and common or ground plate 115, and phase change memory cell 104d is electrically coupled to bit line 112b, word line 110b, and common or ground plate 115.

Each phase change memory cell 104 includes a phase change element 106 and a transistor 108. Phase change memory cell 104a includes phase change element 106a and transistor 108a. One side of phase change element 106a is electrically coupled to common or ground plate 115 through the plate of phase change material, and the other side of phase change element 106a is electrically coupled to one side of the source-drain path of transistor 108a. The other side of the source-drain path of transistor 108a is electrically coupled to bit line 112a. The gate of transistor 108a is electrically coupled to word line 110a. Phase change memory cell 104b includes phase change element 106b and transistor 108b. One side of phase change element 106b is electrically coupled to common or ground plate 115 through the plate of phase change material, and the other side of phase change element 106b is electrically coupled to one side of the source-drain path of transistor 108b. The other side of the source-drain path of transistor 108b is electrically coupled to bit line 112a. The gate of transistor 108b is electrically coupled to word line 110b.

Phase change memory cell 104c includes phase change element 106c and transistor 108c. One side of phase change element 106c is electrically coupled to common or ground plate 115 through the plate of phase change material, and the other side of phase change element 106c is electrically coupled to one side of the source-drain path of transistor 108c. The other side of the source-drain path of transistor 108c is electrically coupled to bit line 112b. The gate of transistor 108c is electrically coupled to word line 110a. Phase change memory cell 104d includes phase change element 106d and transistor 108d. One side of phase change element 106d is electrically coupled to common or ground plate 115 through the plate of phase change material, and the other side of phase change element 106d is electrically coupled to one side of the source-drain path of transistor 108d. The other side of the source-drain path of transistor 108d is electrically coupled to bit line 112b. The gate of transistor 108d is electrically coupled to word line 110b.

In operation of one embodiment during a write operation of phase change memory cell 104a, a ground potential is applied to common or ground plate 115, and word line 110a is selected to activate transistor 108a. A negative programming voltage is applied to bit line 112a while bit line 112b and the other unselected bit lines 112 in memory array 101 are connected to ground or allowed to float. In one embodiment during a read operation of phase change memory cell 104a, a ground potential is applied to common or ground plate 115, and word line 110a is selected to activate transistor 108a. A positive or negative read voltage is applied to bit line 112a while bit line 112b and the other unselected bit lines 112 in memory array 101 are connected to ground. With the read voltage applied to bit line 112a, the current through phase change element 106a on bit line 112a is sensed to determine the state of phase change element 106a.

In operation of another embodiment during a write operation of phase change memory cell 104a, a positive supply voltage ($V_{dd}$) is applied to common or ground plate 115, and word line 110a is selected to activate transistor 108a. A zero volts programming voltage is applied to bit line 112a while bit line 112b and the other unselected bit lines 112 in memory array 101 are connected to $V_{dd}$. In another embodiment during a read operation of phase change memory cell 104a, $V_{dd}$ is applied to common or ground plate 115, and word line 110a is selected to activate transistor 108a. A positive read voltage is applied to bit line 112a while bit line 112b and the other unselected bit lines 112 in memory array 101 are connected to $V_{dd}$. With the read voltage applied to bit line 112a, the current through phase change element 106a on bit line 112a is sensed to determine the state of phase change element 106a.

In operation of another embodiment during a write operation of phase change memory cell 104a, a ground potential is applied to common or ground plate 115, and word line 110a is selected to activate transistor 108a. A $V_{dd}$ programming voltage is applied to bit line 112a while bit line 112b and the other unselected bit lines 112 in memory array 101 are connected to ground or allowed to float. In another embodiment during a read operation of phase change memory cell 104a, a ground potential is applied to common or ground plate 115, and word line 110a is selected to activate transistor 108a. A positive or negative read voltage is applied to bit line 112a while bit line 112b and the other unselected bit lines 112 in memory array 101 are connected to $V_{dd}$. With the read voltage applied to bit line 112a, the current through phase change element 106a on bit line 112a is sensed to determine the state of phase change element 106a.

In operation of another embodiment during a write operation of phase change memory cell 104a, $V_{dd}/2$ or other suitable fraction f is applied to common or ground plate 115, and word line 110a is selected to activate transistor 108a. A $-V_{dd}/2$ or corresponding f−1 programming voltage is applied to bit line 112a while bit line 112b and the other unselected bit lines 112 in memory array 101 are connected to $V_{dd}/2$ or f. In another embodiment during a read operation of phase change memory cell 104a, $V_{dd}/2$ or other suitable fraction f is applied to common or ground plate 115, and word line 110a is selected to activate transistor 108a. A positive or negative read voltage is applied to bit line 112a while bit line 112b and the other unselected bit lines 112 in memory array 101 are connected to $V_{dd}/2$ or f. With the read voltage applied to bit line 112a, the current through phase change element 106a on bit line 112a is sensed to determine the state of phase change element 106a. Phase change memory cells 104b-104d and other phase change memory cells 104 in memory array 101 are read and written similarly to phase change memory cell 104a using similar read and write operations.

Figure 8A:
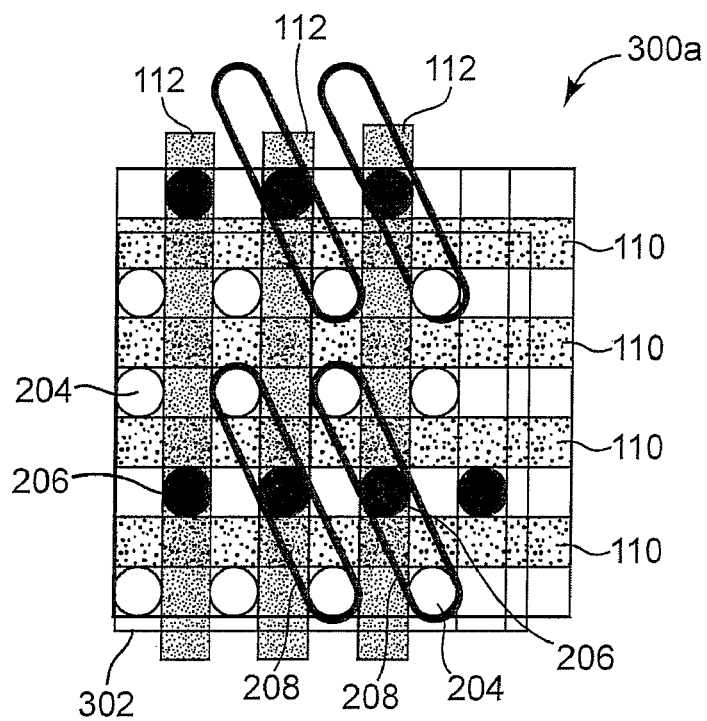
FIG. 8A illustrates a top view of one embodiment of an array of phase change memory cells including a plate of phase change material.

FIG. 8A illustrates a top view of one embodiment of an array of phase change memory cells 300a including a conductive plate and a plate of phase change material as indicated at 302. The conductive plate contacts and is on top of the plate of phase change material. Array of phase change memory cells 300a includes bit lines 112, the conductive plate and plate of phase change material 302, and word lines 110. Memory cells are electrically coupled to the conductive plate and plate of phase change material 302 through contacts 204. Memory cells are electrically coupled to bit lines 112 through contacts 206. Word lines 110 are perpendicular to bit lines 112.

Array of phase change memory cells 300a includes single gate phase change memory cells. Array of phase change memory cells 300a has a cell size down to $6F^2$, where F is the minimum feature size. In other embodiments, wider transistors are used such that the distance between contacts 204 is increased. Bit lines 112 are electrically coupled to one side of the source-drain paths of transistors through contacts 206. Each contact 206 is shared by two transistors for accessing two phase change memory elements. Word lines 110 are electrically coupled to the gates of the transistors. The other sides of the source-drain paths of the transistors are electrically coupled to one side of the phase change memory elements through contacts 204. The other sides of the phase change memory elements are electrically coupled to the plate of phase change material. In one embodiment, the conductive plate and plate of phase change material 302 are above bit lines 112.

The active areas of transistors within array of phase change memory cells 300a are indicated at 208. Active areas 208 are configured diagonally across array of phase change memory cells 300a from an upper left contact 204 to a lower right contact 204. Active areas 208 run from one contact 204 across a first word line 110 to a bit line 112, and from the bit line 112 across a second word line 110 to a second contact 204.

Figure 8B:
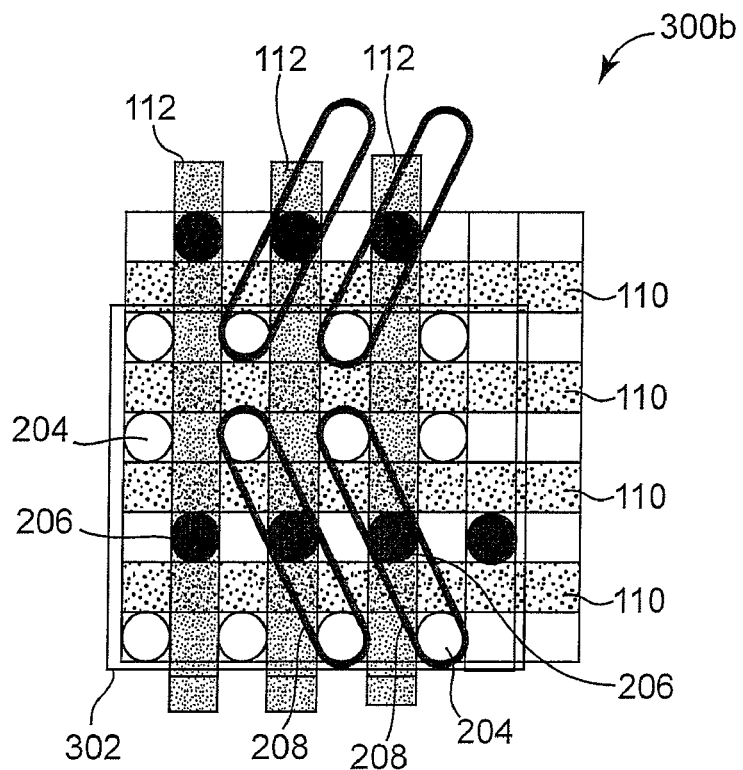
FIG. 8B illustrates a top view of another embodiment of an array of phase change memory cells including a plate of phase change material.

FIG. 8B illustrates a top view of another embodiment of an array of phase change memory cells 300b including a conductive plate and plate of phase change material as indicated at 302. Array of phase change memory cells 300b is similar to array of phase change memory cells 300a previously described and illustrated with reference to FIG. 8A, except that in array of phase change memory cells 300b active areas 208 are configured in alternating diagonal directions across the array. Active areas 208 alternate between running from an upper right contact 204 to a lower left contact 204 and from an upper left contact 204 to a lower right contact 204.

Figure 8C:
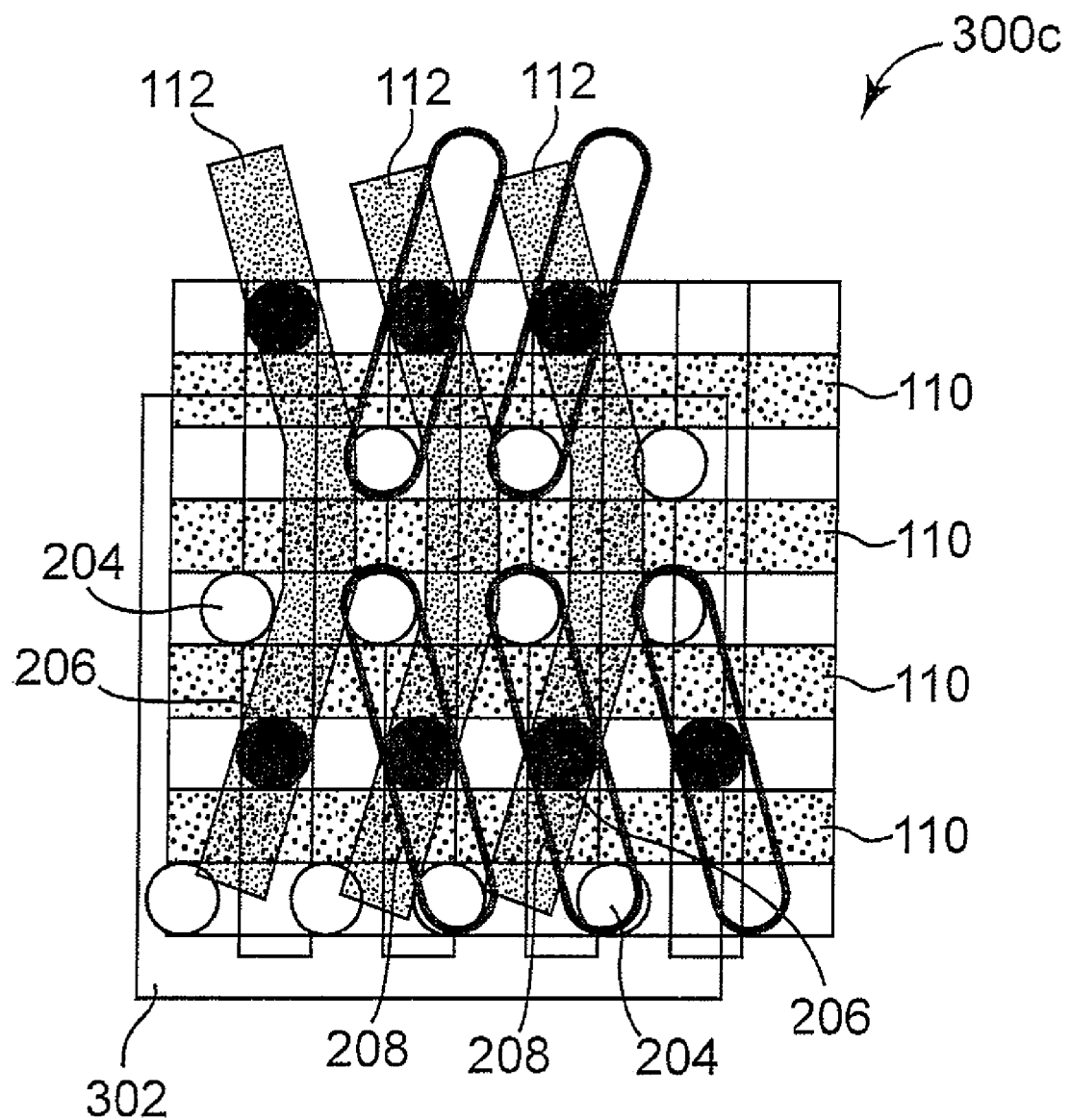
FIG. 8C illustrates a top view of another embodiment of an array of phase change memory cells including a plate of phase change material.

FIG. 8C illustrates a top view of another embodiment of an array of phase change memory cells 300c including a conductive plate and plate of phase change material as indicated at 302. Array of phase change memory cells 300c is similar to array of phase change memory cells 300b previously described and illustrated with reference to FIG. 8B, except that in array of phase change memory cells 300c bit lines 112 are not straight lines. Bit lines 112 zigzag across array of phase change memory cells 300c between contacts 204.

Figure 9A:
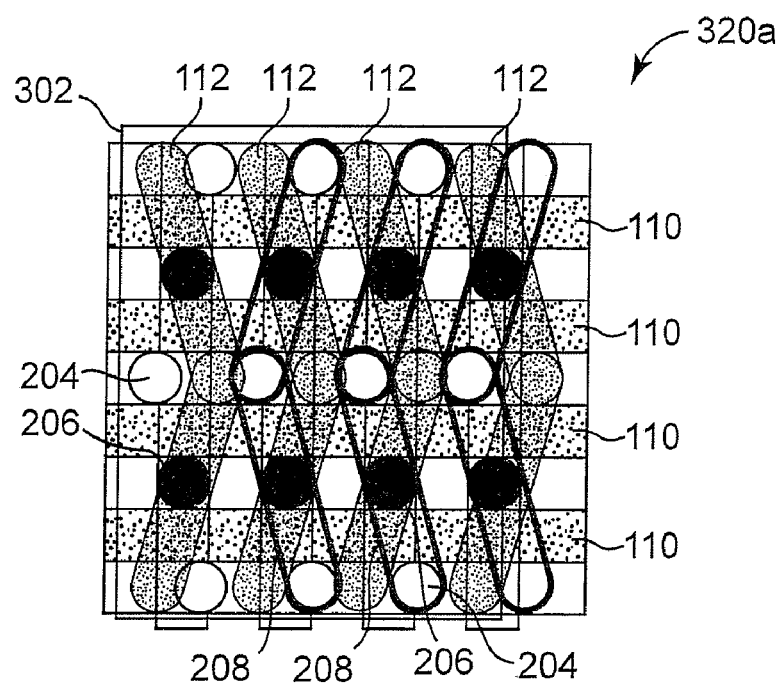
FIG. 9A illustrates a top view of another embodiment of an array of phase change memory cells including a plate of phase change material.

FIG. 9A illustrates a top view of another embodiment of an array of phase change memory cells 320a including a conductive plate and plate of phase change material as indicated at 302. Array of phase change memory cells 320a includes bit lines 112, the conductive plate and plate of phase change material 302, and word lines 110. Memory cells are electrically coupled to the conductive plate and plate of phase change material 302 through contacts 204. Memory cells are electrically coupled to bit lines 112 through contacts 206. Word lines 110 are straight lines and bit lines 112 are not straight lines. Bit lines 112 zigzag across the array of phase change memory cells between contacts 204.

Array of phase change memory cells 320a includes dual gate phase change memory cells. Array of phase change memory cells 320a has a cell size down to $6F^2$, where F is the minimum feature size. Bit lines 112 are electrically coupled to one side of the source-drain paths of the transistors through contacts 206. Each contact 206 is shared by two transistors for accessing two phase change memory elements. Word lines 110 are electrically coupled to the gates of the transistors. The other sides of the source-drain paths of the transistors are electrically coupled to one side of phase change memory elements through contacts 204. The other sides of the phase change memory elements are electrically coupled to the plate of phase change material. In one embodiment, the conductive plate and plate of phase change material 302 are above bit lines 112.

The active areas of transistors within array of phase change memory cells 320a are indicated at 208. Active areas 208 are configured in alternating diagonal directions across array of phase change memory cells 320a. Active areas 208 alternate between running from an upper right contact 204 to a lower left contact 204 and from the upper left contact 204 to a lower right contact 204. Active areas 208 run from one contact 204 across a first word line 110 to a bit line 112, and from the bit line 112 across a second word line 110 to a second contact 204.

Figure 9B:
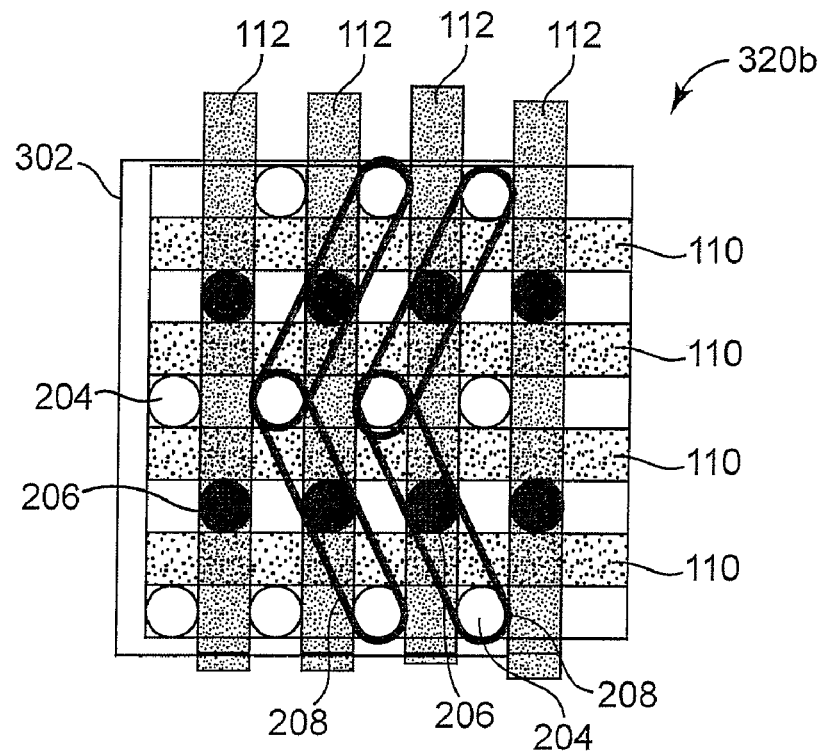
FIG. 9B illustrates a top view of another embodiment of an array of phase change memory cells including a plate of phase change material.

FIG. 9B illustrates a top view of another embodiment of an array of phase change memory cells 320b including a conductive plate and plate of phase change material as indicated at 302. Array of phase change memory cells 320b is similar to array of phase change memory cells 320a previously described and illustrated with reference to FIG. 9A, except that in array of phase change memory cells 320b bit lines 112 are straight lines and are substantially perpendicular to word lines 110.

Figure 9C:
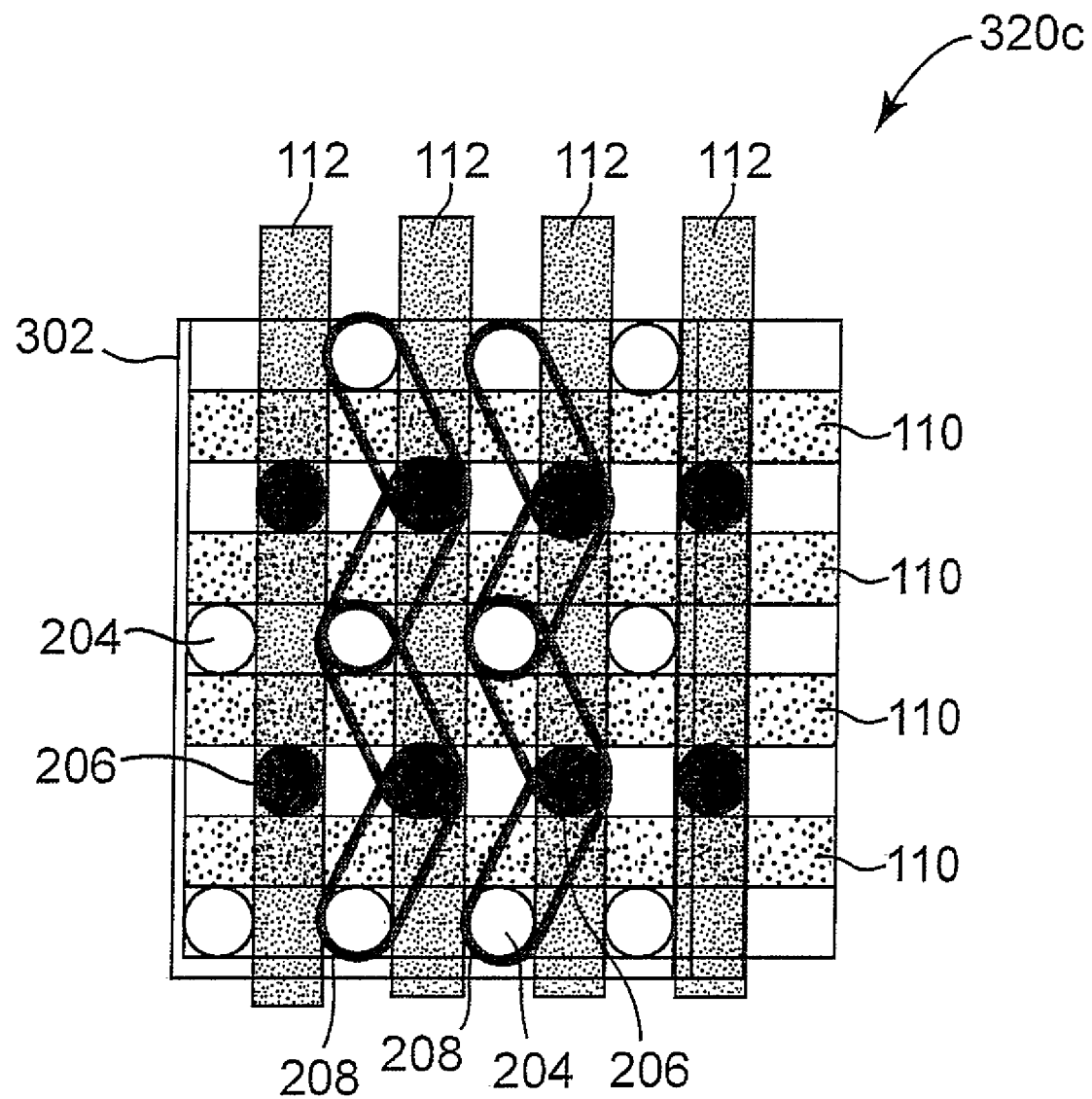
FIG. 9C illustrates a top view of another embodiment of an array of phase change memory cells including a plate of phase change material.

FIG. 9C illustrates a top view of another embodiment of an array of phase change memory cells 320c including a conductive plate and plate of phase change material as indicated at 302. Array of phase change memory cells 320c is similar to array of phase change memory cells 320b previously described and illustrated with reference to FIG. 9B, except that in array of phase change memory cells 320c active areas 208 alternate direction at each phase change element. Active areas 208 zigzag across array of phase change memory cells 320c along each bit line 112.

Figure 10A:
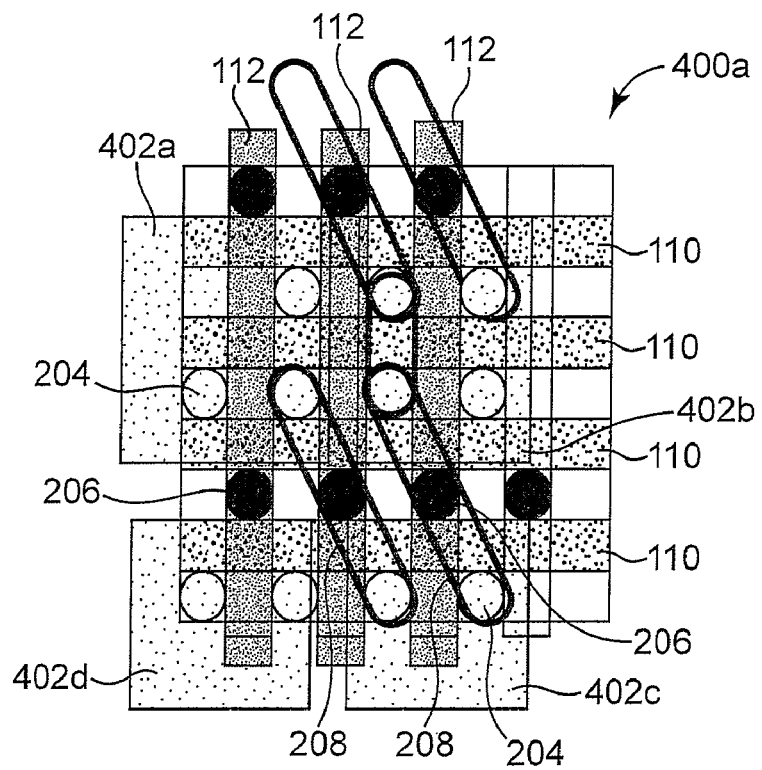
FIG. 10A illustrates a top view of one embodiment of an array of phase change memory cells including several mini-plates of phase change material.

FIG. 10A illustrates a top view of one embodiment of an array of phase change memory cells 400a including several mini-plates of conductive material and phase change material as indicated at 402a-402d. Each conductive mini-plate contacts and is on top of each mini-plate of phase change material. Array of phase change memory cells 400a is similar to array of phase change memory cells 300a previously described and illustrated with reference to FIG. 8A, except that in array of phase change memory cells 400a, the conductive plate and plate of phase change material 302 is replaced with mini-plates 402a-402d. Each mini-plate 402a-402d contacts 4, 8, 16, 32, 64, 128, or other suitable number of phase change elements. In one embodiment, mini-plates 402a-402d reduce the power consumption of array of phase change memory cells 400a as compared to array of phase change memory cells 300a by reducing the current used to charge a plate during read and write operations.

Figure 10B:
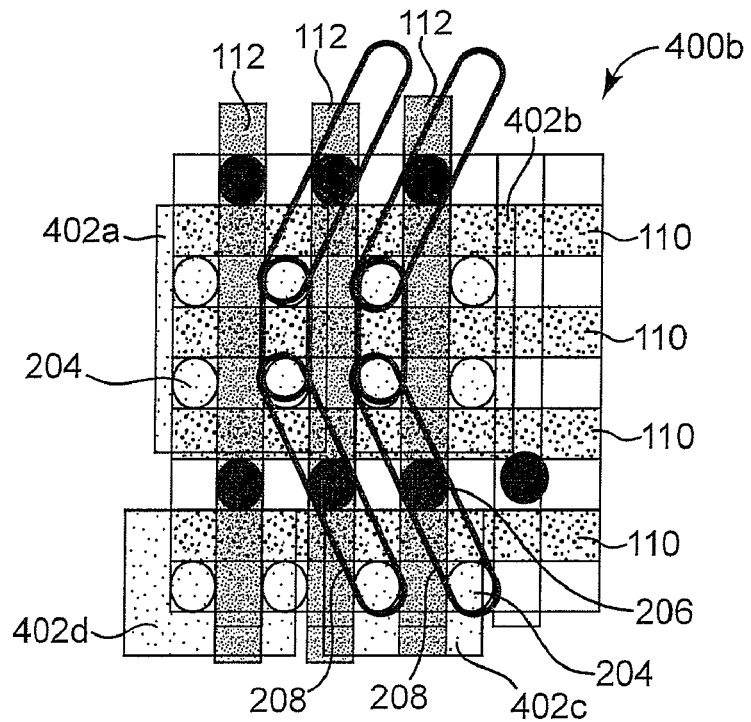
FIG. 10B illustrates a top view of another embodiment of an array of phase change memory cells including several mini-plates of phase change material.

FIG. 10B illustrates a top view of another embodiment of an array of phase change memory cells 400b including several mini-plates of conductive material and phase change material as indicated at 402a-402d. Each conductive mini-plate contacts and is on top of each mini-plate of phase change material. Array of phase change memory cells 400b is similar to array of phase change memory cells 300b previously described and illustrated with reference to FIG. 8B, except that in array of phase change memory cells 400b, the conductive plate and plate of phase change material 302 is replaced with mini-plates 402a-402d. Each mini-plate 402a-402d contacts 4, 8, 16, 32, 64, 128, or other suitable number of phase change elements. In one embodiment, mini-plates 402a-402d reduce the power consumption of array of phase change memory cells 400b as compared to array of phase change memory cells 300b by reducing the current used to charge a plate during read and write operations.

Figure 10C:
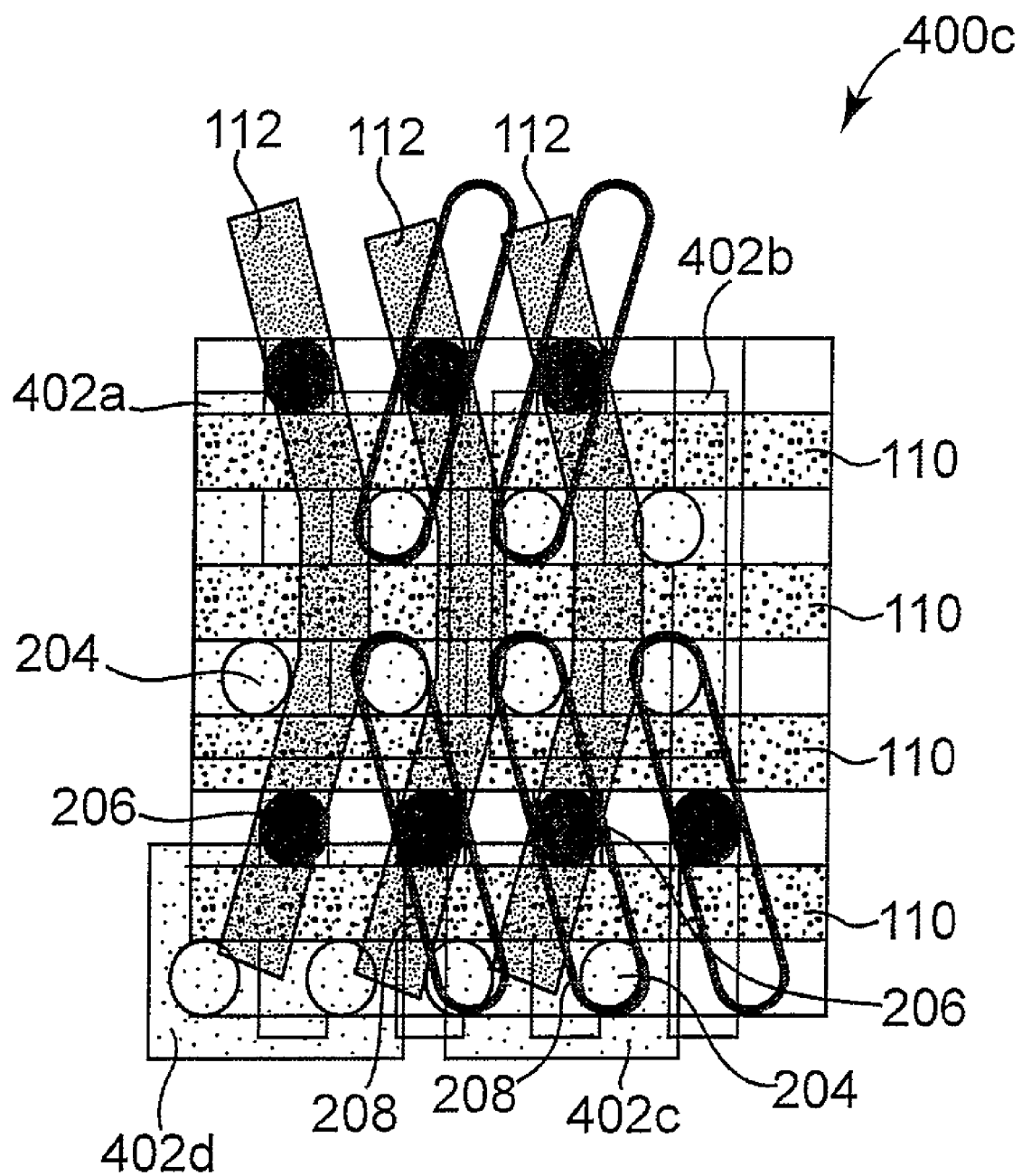
FIG. 10C illustrates a top view of another embodiment of an array of phase change memory cells including several mini-plates of phase change material.

FIG. 10C illustrates a top view of another embodiment of an array of phase change memory cells 400c including several mini-plates of conductive material and phase change material as indicated at 402a-402d. Each conductive mini-plate contacts and is on top of each mini-plate of phase change material. Array of phase change memory cells 400c is similar to array of phase change memory cells 300c previously described and illustrated with reference to FIG. 8C, except that in array of phase change memory cells 400c, the conductive plate and plate of phase change material 302 is replaced with mini-plates 402a-402d. Each mini-plate 402a-402d contacts 4, 8, 16, 32, 64, 128, or other suitable number of phase change elements. In one embodiment, mini-plates 402a-402d reduce the power consumption of array of phase change memory cells 400c as compared to array of phase change memory cells 300c by reducing the current used to charge a plate during read and write operations.

Figure 11A:
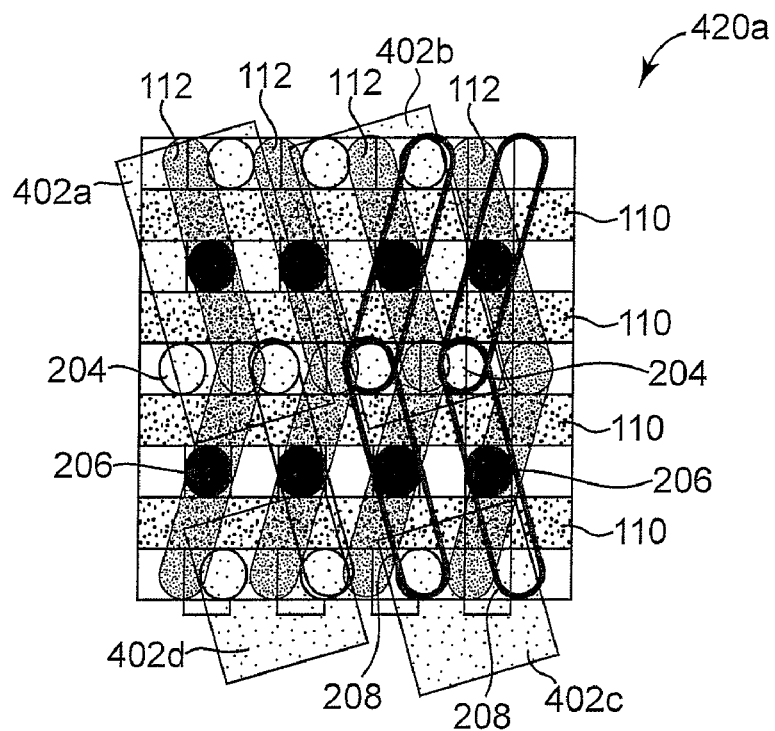
FIG. 11A illustrates a top view of another embodiment of an array of phase change memory cells including several mini-plates of phase change material.

FIG. 11A illustrates a top view of another embodiment of an array of phase change memory cells 420a including several mini-plates of conductive material and phase change material as indicated at 402a-402d. Each conductive mini-plate contacts and is on top of each mini-plate of phase change material. Array of phase change memory cells 420a is similar to array of phase change memory cells 320a previously described and illustrated with reference to FIG. 9A, except that in array of phase change memory cells 420a, the conductive plate and plate of phase change material 302 is replaced with mini-plates 402a-402d. Each mini-plate 402a-402d contacts 4, 8, 16, 32, 64, 128, or other suitable number of phase change elements. In one embodiment, mini-plates 402a-402d reduce the power consumption of array of phase change memory cells 420a as compared to array of phase change memory cells 320a by reducing the current used to charge a plate during read and write operations.

Figure 11B:
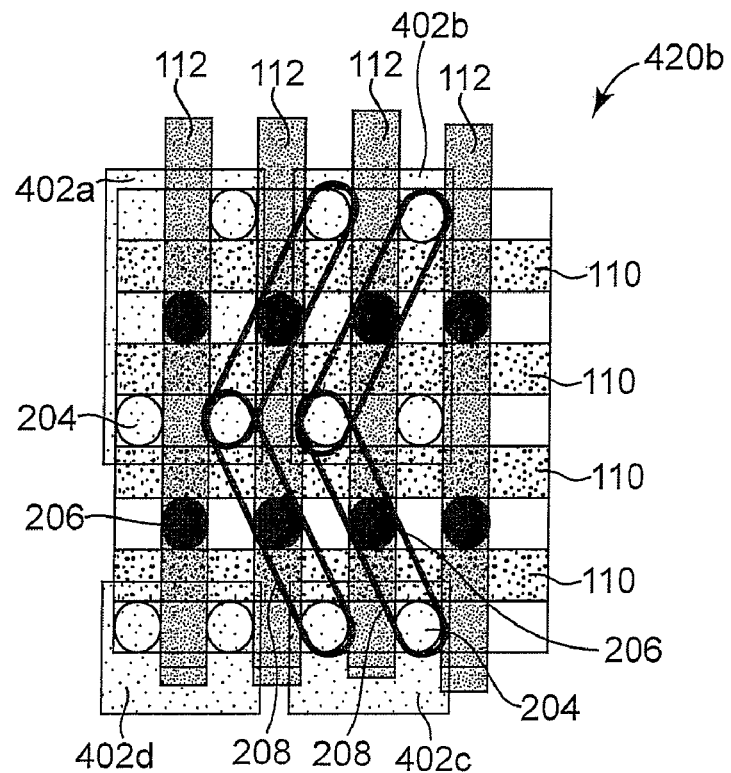
FIG. 11B illustrates a top view of another embodiment of an array of phase change memory cells including several mini-plates of phase change material.

FIG. 11B illustrates a top view of another embodiment of an array of phase change memory cells 420b including several mini-plates of conductive material and phase change material as indicated at 402a-402d. Each conductive mini-plate contacts and is on top of each mini-plate of phase change material. Array of phase change memory cells 420b is similar to array of phase change memory cells 320b previously described and illustrated with reference to FIG. 10B, except that in array of phase change memory cells 420b, the conductive plate and plate of phase change material 302 is replaced with mini-plates 402a-402d. Each mini-plate 402a-402d contacts 4, 8, 16, 32, 64, 128, or other suitable number of phase change elements. In one embodiment, mini-plates 402a-402d reduce the power consumption of array of phase change memory cells 420b as compared to array of phase change memory cells 320b by reducing the current used to charge a plate during read and write operations.

Figure 11C:
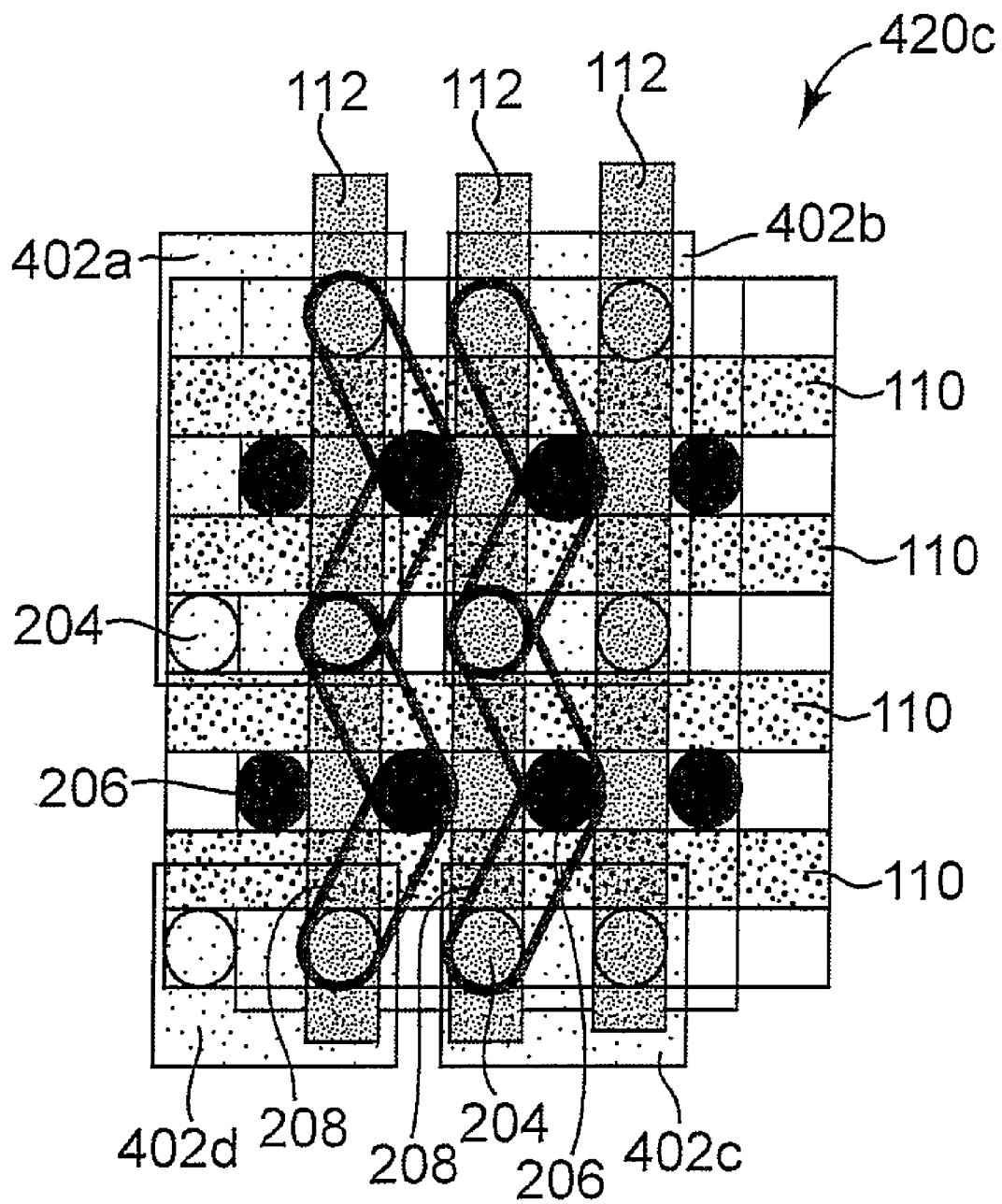
FIG. 11C illustrates a top view of another embodiment of an array of phase change memory cells including several mini-plates of phase change material.

FIG. 11C illustrates a top view of another embodiment of an array of phase change memory cells 420c including several mini-plates of conductive material and phase change material as indicated at 402a-402d. Each conductive mini-plate contacts and is on top of each mini-plate of phase change material. Array of phase change memory cells 420c is similar to array of phase change memory cells 320c previously described and illustrated with reference to FIG. 9C, except that in array of phase change memory cells 420c, the conductive plate and plate of phase change material 302 is replaced with mini-plates 402a-402d. Each mini-plate 402a-402d contacts 4, 8, 16, 32, 64, 128, or other suitable number of phase change elements. In one embodiment, mini-plates 402a-402d reduce the power consumption of array of phase change memory cells 420c as compared to array of phase change memory cells 320c by reducing the current used to charge a plate during read and write operations.

Figure 12A:
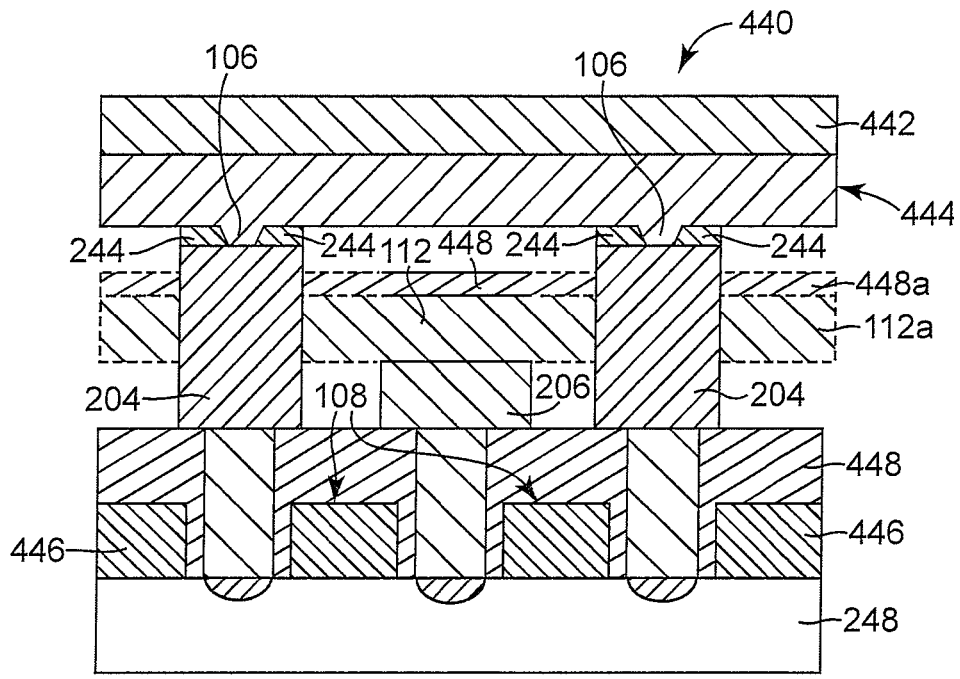
FIG. 12A illustrates a simplified side view of one embodiment of an array of phase change memory cells including a plate of phase change material.
Figures 12B, 12C:
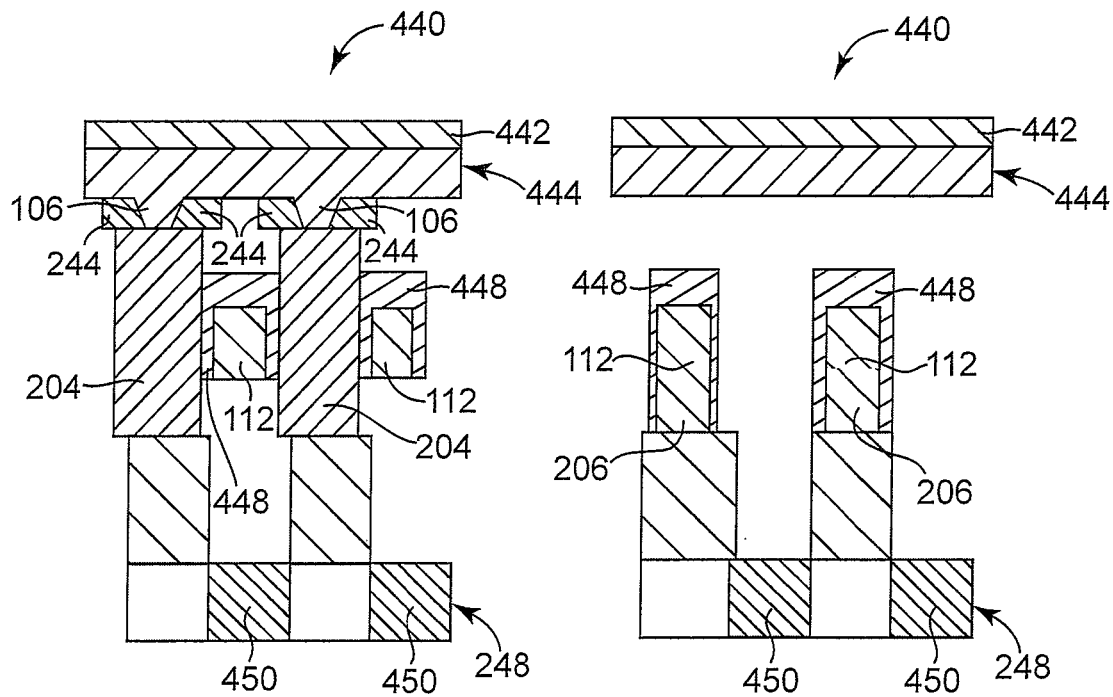
FIG. 12B illustrates a simplified side view of one embodiment of an array of phase change memory cells including a plate of phase change material.
FIG. 12C illustrates a simplified side view of one embodiment of an array of phase change memory cells including a plate of phase change material.

FIG. 12A illustrates a simplified side view of one embodiment of an array of phase change memory cells 440 including a conductive plate 442 and a plate of phase change material 444. FIG. 12A is taken diagonally along an active area 208 (FIG. 8A) and to a contact 204 in the same column with a contact 204 that is part of active area 208. FIG. 12B illustrates a simplified side view of one embodiment of array of phase change memory cells 440 through a phase change element 106, and FIG. 12C illustrates another simplified side view of one embodiment of array of phase change memory cells 440 through a bit line 112. In one embodiment, conductive plate 442 and plate of phase change material 444 are similar to the conductive plate and plate of phase change material 302 described and illustrated with reference to FIGS. 8A-9C. In another embodiment, conductive plate 442 and plate of phase change material 440 are similar to the mini-plates 402 described and illustrated with reference to FIGS. 10A-11C.

Array of phase change memory cells 440 includes substrate 248 including shallow trench isolation (STI) 450, transistors 108, isolation gates 446, conductive plate 442, insulation material 244, phase change elements 106, phase change element contacts 204, bit line contacts 206, bit lines 112, and dielectric material 448. Dielectric material 448a and bit line 112a are part of dielectric material 448 and bit line 112 but are located behind phase change element contacts 204.

Transistors 108 for selecting phase change elements 106 are formed on substrate 248. The gates of transistors 108 are electrically coupled to word lines 110. Isolation gates 446 are formed on substrate 248 between transistors 108. Dielectric material 448 is deposited over transistors 108 and isolation gates 406. Phase change element contacts 204 electrically couple one side of the source-drain path of each transistor 108 to a phase change element 106, and bit line contacts 206 electrically couple the other side of the source-drain path of each transistor 108 to a bit line 112. Insulation material 244 laterally surrounds phase change elements 106.

In one embodiment, dielectric material 448, which caps bit lines 112, includes SiN or another suitable material. Plate of phase change material 444 electrically couples phase change elements 106 to conductive plate 442.

During fabrication of array of phase change memory cells 440, phase change material is deposited over an insulation material layer that has had V-shaped openings etched into it to expose portions of contacts 204. In one embodiment, the V-shaped openings are tapered vias etched into the insulation material layer. In another embodiment, the V-shaped openings are trenches etched into the insulation material layer. In any case, the phase change material fills the openings and covers the insulation material layer. A phase change element 106 is formed at each intersection of the phase change material and a contact 204. The phase change material is then planarized to form a plate of phase change material. The plate of phase change material is optionally etched to form mini-plates of phase change material. In another embodiment, a conductive material is deposited over the plate of phase change material and the conductive plate and the plate of phase change material are both optionally etched to form mini-plates of conductive material and phase change material. In either embodiment, individual etching of each phase change element 106 and thus edge damage due to the etching is avoided. In another embodiment, the phase change material is not planarized and indentations 243 as illustrated in FIG. 3B are present in plate of phase change material 444. In other embodiments, one of storage locations 250a-250g as illustrated in FIGS. 4A-6B can be used in place of the V-shaped phase change elements illustrated in FIGS. 12A and 12B.

Embodiments of the present invention provide a phase change memory in which etching of phase change material to form individual phase change elements is avoided. More than two memory cells in the phase change memory share a common deposit of phase change material. The common deposit of phase change material may include a line of phase change material running along each bit line, a plate of phase change material covering the entire array of memory cells, or mini-plates of phase change material covering portions of the array of memory cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    a bit line;
    a plurality of access devices electrically coupled to the bit line;
    a plate of phase change material;
    a plurality of phase change elements arranged in at least two rows and in a least two columns, each phase change element laterally surrounded by insulation material and directly contacting the plate of phase change material; and
    a plurality of first contacts arranged in the at least two rows and in the at least two columns, each first contact electrically coupled between an access device and a phase change element,
    wherein the plate of phase change material extends over the plurality of first contacts.

2. The integrated circuit of claim 1, wherein each phase change element is defined by a via formed in the insulation material.

3. The integrated circuit of claim 1, further comprising:
a plurality of heater contacts, each heater contact electrically coupled between a phase change element and a first contact.

4. The integrated circuit of claim 1, wherein each access device comprises a transistor.

5. The integrated circuit of claim 1, wherein the plate of phase change material and the plurality of phase change elements comprise at least one of Ge, Sb, Te, Ga, As, In, Se, and S.

6. The integrated circuit of claim 1, wherein each first contact comprises a metal contact.

7. The integrated circuit of claim 1, wherein the bit line is not a straight line.

8. The integrated circuit of claim 1, wherein the plate of phase change material comprises indentations above each phase change element.

9. The integrated circuit of claim 2, wherein each phase change element comprises tapered sidewalls defined by the via.

10. The integrated circuit of claim 3, wherein each heater contact is cup shaped.

11. An integrated circuit comprising:
a bit line;
a plurality of access devices, a first side of each access device electrically coupled to the bit line;
a plate of phase change material;
a plurality of phase change elements contacting the plate of phase change material, each phase change element laterally surrounded by insulation material; and
a plurality of first contacts, each first contact electrically coupled between a second side of each access device opposite the first side and a phase change element.

12. The integrated circuit of claim 11, further comprising:
a plurality of heater contacts, each heater contact electrically coupled between a phase change element and a first contact.

13. An integrated circuit comprising:
a bit line;
a plurality of access devices, a first side of each access device electrically coupled to the bit line;
a plate of phase change material;
a plurality of phase change elements contacting the plate of phase change material, the plurality of phase change elements arranged in at least two rows and in at least two columns, and each phase change element laterally surrounded by insulation material; and
a plurality of electrodes, each electrode electrically coupled between a second side of each access device opposite the first side and a phase change element.

14. The integrated circuit of claim 13, wherein each phase change element is defined by a via formed in the insulation material.

15. The integrated circuit of claim 13, further comprising:
a plurality of heater contacts, each heater contact electrically coupled between a phase change element and an electrode.

16. The integrated circuit of claim 13, wherein each access device comprises a transistor.

17. The integrated circuit of claim 13, wherein the plate of phase change material and the plurality of phase change elements comprise at least one of Ge, Sb, Te, Ga, As, In, Se, and S.

18. The integrated circuit of claim 13, wherein each electrode comprises a metal electrode.

19. The integrated circuit of claim 13, wherein the bit line is not a straight line.

20. The integrated circuit of claim 13, wherein the plate of phase change material comprises indentations above each phase change element.

21. The integrated circuit of claim 14, wherein each phase change element comprises tapered sidewalls defined by the via.

22. The integrated circuit of claim 15, wherein each electrode comprises a first metal, and
wherein each heater contact comprises a second metal different from the first metal.

23. The integrated circuit of claim 15, wherein each heater contact is cup shaped.

* * * * *